(12) United States Patent
Kammler et al.

(10) Patent No.: US 8,198,166 B2
(45) Date of Patent: Jun. 12, 2012

(54) USING HIGH-K DIELECTRICS AS HIGHLY SELECTIVE ETCH STOP MATERIALS IN SEMICONDUCTOR DEVICES

(75) Inventors: Thorsten Kammler, Ottendorf-Okrilla (DE); Ralf Richter, Dresden (DE); Markus Lenski, Dresden (DE); Gunter Grasshoff, Radebeul (DE)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 12/844,135

(22) Filed: Jul. 27, 2010

(65) Prior Publication Data

US 2011/0024805 A1 Feb. 3, 2011

(30) Foreign Application Priority Data

Jul. 31, 2009 (DE) .......................... 10 2009 035 438

(51) Int. Cl.
*H01L 21/00* (2006.01)
(52) U.S. Cl. ...................... 438/303; 438/785
(58) Field of Classification Search .................. 438/785, 438/301–305, 231
See application file for complete search history.

(56) References Cited

U.S. PATENT DOCUMENTS

| | | | | |
|---|---|---|---|---|
| 5,013,675 | A | 5/1991 | Shen et al. | 437/44 |
| 6,461,914 | B1* | 10/2002 | Roberts et al. | 438/253 |
| 6,498,067 | B1 | 12/2002 | Perng et al. | 438/305 |
| 6,902,969 | B2* | 6/2005 | Adetutu et al. | 438/199 |
| 7,456,062 | B1 | 11/2008 | En et al. | 438/231 |
| 2005/0118769 | A1 | 6/2005 | Kammler et al. | 438/303 |
| 2010/0270622 | A1* | 10/2010 | Nandakumar et al. | 257/368 |

OTHER PUBLICATIONS

Translation of Official Communication from German Patent Office for German Patent Application No. 10 2009 035 438.7 dated Mar. 29, 2010.

* cited by examiner

*Primary Examiner* — Richard A. Booth
(74) *Attorney, Agent, or Firm* — Williams, Morgan & Amerson, P.C.

(57) ABSTRACT

A spacer structure in sophisticated semiconductor devices is formed on the basis of a high-k dielectric material, which provides superior etch resistivity compared to conventionally used silicon dioxide liners. Consequently, a reduced thickness of the etch stop material may nevertheless provide superior etch resistivity, thereby reducing negative effects, such as dopant loss in the drain and source extension regions, creating a pronounced surface topography and the like, as are typically associated with conventional spacer material systems.

17 Claims, 4 Drawing Sheets

USING HIGH-K DIELECTRICS AS HIGHLY SELECTIVE ETCH STOP MATERIALS IN SEMICONDUCTOR DEVICES

BACKGROUND OF THE INVENTION

1. Field of the Invention

The present disclosure generally relates to the fabrication of integrated circuits, and, more particularly, to the fabrication of sophisticated integrated circuits including transistor structures with complex dopant profiles generated on the basis of ion implantation.

2. Description of the Related Art

The manufacturing process for integrated circuits continues to improve in several ways, driven by the ongoing efforts to scale down the feature sizes of the individual circuit elements. A key issue in developing integrated circuits of increased packing density and enhanced performance is the scaling of transistor elements, such as MOS transistor elements, to increase the number of transistor elements in order to enhance performance of modern CPUs and the like with respect to operating speed and functionality. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, which may also be referred to as a substrate or a well region.

Although the reduction of the gate length is necessary for obtaining smaller and faster transistor elements, it turns out, however, that a plurality of issues are additionally involved to maintain proper transistor performance for a reduced gate length. For example, so-called short channel effects may occur for highly scaled transistor elements, resulting in a reduced controllability of the channel region, which may result in increased leakage currents and generally in degraded transistor performance. One challenging task in this respect is, therefore, the provision of appropriately designed junction regions in the form of shallow junctions, at least at the area in the vicinity of the channel region, i.e., source and drain extension regions, which nevertheless exhibit a moderately high conductivity so as to maintain the resistivity in conducting charge carriers from the channel to a respective contact area of the drain and source regions at a relatively low level, while also controlling the parasitic drain/source capacitance and the electric field of the cut-off region. The requirement for shallow junctions having a relatively high conductivity while providing adequate channel control is commonly met by performing an ion implantation sequence on the basis of a spacer structure so as to obtain a high dopant concentration having a profile that varies laterally and in depth. The introduction of a high dose of dopants into a crystalline substrate area, however, generates heavy damage in the crystal structure, and, therefore, one or more anneal cycles are typically required for activating the dopants, i.e., for placing the dopants at crystal sites, and to cure the crystal damage. However, the electrically effective dopant concentration is limited by the ability of the anneal cycles to electrically activate the dopants. This ability, in turn, is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile. This effect may be advantageous in some cases for defining critical transistor properties, such as the overlap between the extension regions and the gate electrode. On the other hand, the dopant diffusion may also result in a migration of dopants from the shallow extension regions into a portion of the spacer structure, such as a silicon dioxide etch stop or liner material, thereby contributing to a loss of dopants, which may not be readily taken into consideration due to the above-specified limitations. Therefore, for highly advanced transistors, the positioning, shaping and maintaining of a desired dopant profile are important properties for defining the final performance of the device, since the overall series resistance of the conductive path between the drain and source contacts, as well as the controllability of the channel region, may represent a dominant aspect for determining the transistor performance.

The dopant profiles are adjusted on the basis of a sidewall spacer structure which typically includes one or more spacer elements formed of silicon nitride material in combination with an appropriate etch stop liner material, such as undoped silicon dioxide. Consequently, the width of the spacer structure and thus the definition of the entry point of an implantation species during the complex implantation sequence may be defined on the basis of the initial layer thickness of the spacer layer stack and the corresponding etch process parameters. The patterning of the spacer layer stack is typically accomplished on the basis of sophisticated plasma assisted etch techniques. As is well known, one issue in shrinking overall dimensions of feature sizes is the requirement for patterning the features on the basis of advanced lithography techniques in combination with complex etch processes. In the case of patterning a spacer element, the previously obtained device topography may be advantageously used in order to form the spacer elements in a self-aligned manner on the basis of plasma assisted dry etch techniques, in which a plasma ambient is established by using reactive gas components. The particles in the reactive ambient react with the surface to be etched, wherein, typically, the ambient may cause a different removal rate for different materials that are in contact with the reactive plasma ambient. Moreover, during a plasma assisted etch process, the ions may be accelerated towards the surface to be etched, thereby also imparting a physical component to the removal rate, which contributes to superior directionality of the removal process. In addition, appropriate polymer substances may be added, which may also allow an adjustment of the directionality of the etch front, thereby enabling a highly "anisotropic" etch behavior. The mechanism of plasma etching depends on the capability of the reactive component to form a volatile etch byproduct, which is released into the process ambient, thereby increasingly removing material from the exposed surface. Frequently, it is important to protect deeper lying materials from exposure to the plasma ambient or a defined depth for stopping the etch process across the entire surface is required, which is typically accomplished by providing an etch stop material, which is to be understood as a material having a significantly reduced removal rate compared to the material that is actually to be etched in the plasma ambient. Consequently, the material of interest may be etched "selectively" with respect to the etch stop material, which may be accomplished on the basis of a plurality of well-established etch chemistries. For example, the critical process for forming spacer elements is typically performed by using a material system including the silicon dioxide as an etch stop material and the silicon nitride as the actual spacer material, since, for these materials, highly efficient and selective plasma assisted etch recipes are available.

Upon further shrinking transistor dimensions, the corresponding spacer structures also have to be adapted, wherein, however, the thickness of the etch stop material may not be correspondingly scaled down unless undue material erosion of the etch stop material and of any underlying materials may be caused during the further processing of the device. For instance, although presently available etch chemistries exhibit a very high degree of selectivity for the material system silicon dioxide/silicon nitride, nevertheless a pronounced over etch time may typically have to be applied in order to reliably remove the silicon nitride material from certain device areas across the entire substrate. Consequently, in such areas, the remaining etch stop material may have a significantly reduced thickness or may be entirely removed, thereby exposing these device areas, which may result in significant material loss in subsequent process steps. For instance, a significant material loss may occur in isolation structures relative to adjacent active semiconductor regions, thereby contributing a pronounced surface topography, which, in turn, may negatively affect the further processing and thus the finally achieved performance of sophisticated transistor elements.

Moreover, as previously discussed, extremely sophisticated shallow dopant profiles may be required adjacent to the channel region of the field effect transistors, in particular if extremely short channel transistors are considered, so that a high dopant concentration may be required at a reduced penetration depth. Thereafter, one or more sidewall spacers may typically be required for further profiling the lateral dopant concentration in the drain and source areas, which is accomplished on the basis of the well-established silicon dioxide/silicon nitride material system. Due to the restrictions in view of a minimum thickness of the silicon dioxide etch stop material, however, a moderately thick liner may be in direct contact with the drain and source extension regions, which may result in a significant degree of dopant diffusion during any high temperature processes, thereby resulting in a certain degree of "dopant depletion" of the drain and source extension areas.

Since a further increase in etch selectivity, which would allow the selection of a reduced thickness of the silicon dioxide etch stop material, may be difficult to be achieved on the basis of well-established process recipes, a further device scaling may result in increased transistor variability due to a pronounced dopant out-diffusion from the drain and source extension areas. Moreover, the implementation of other performance increasing mechanisms, such as the provision of strain-inducing dielectric materials above basic transistor configurations and/or the provision of an embedded strain-inducing semiconductor alloy in the drain and source areas of transistors, may also be affected by the fact that a significant topography may be generated during the further processing of the sophisticated transistor devices after forming the well-established silicon dioxide/silicon nitride-based spacer structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods for forming the same in which superior etch stop capabilities may be achieved on the basis of a desired reduced layer thickness of an etch stop material by using a high-k dielectric material in forming spacer elements for any type of circuit elements of semiconductor devices. For this purpose, the characteristics of a plurality of high-k dielectric materials may be advantageously exploited, as these high-k dielectric materials do not substantially generate any volatile etch byproducts upon exposure to well-established anisotropic etch recipes, which are typically used in microelectronic manufacturing techniques. For this reason, a reduced thickness may be sufficient for reliably stopping a plasma assisted etch front so that also during subsequent process steps underlying materials may be covered by the high-k dielectric etch stop materials. In this context, it should be understood that a high-k dielectric material is to be understood as a dielectric material having a dielectric constant of approximately 10.0 or higher, which is significantly greater than the dielectric constant of well-established dielectric materials, such as silicon nitride ($k \approx 7.0$), silicon dioxide ($k \approx 4$-$5$) and the like. The dielectric constant of a material may be efficiently determined on the basis of well-established measurement techniques.

Due to the high degree of stability of the high-k dielectric materials, the spacer structures may be provided with a reduced thickness of the etch stop material, thereby also reducing the degree of out-diffusion of dopants from sensitive device areas, such as drain and source extension regions, in combination with a spacer material that may provide superior diffusion blocking capabilities, such as silicon nitride. Moreover, the overall surface topography upon further processing may be enhanced, for instance, a height difference between isolation structures and adjacent active regions may be reduced, thereby achieving superior process conditions during critical processes, such as the deposition of an interlayer dielectric material and the patterning of corresponding contact elements.

One illustrative method disclosed herein comprises forming a spacer layer stack above a circuit feature that is formed above an active region of a semiconductor device, wherein the spacer layer stack comprises an etch stop liner and a spacer material formed above the etch stop liner, and wherein the etch stop liner comprises a high-k dielectric material. The method further comprises forming a spacer element on sidewalls of the circuit feature by performing a plasma assisted etch process and using the etch stop liner as an etch stop material.

A further illustrative method disclosed herein comprises forming a high-k dielectric material layer above an active region of a transistor so as to cover a gate electrode structure formed at least partially on the active region. The method further comprises forming a spacer layer on the high-k dielectric material layer and forming a spacer element from the spacer layer at sidewalls of the gate electrode structure by performing a plasma assisted etch process and by using the high-k dielectric material layer as an etch stop material.

One illustrative semiconductor device disclosed herein comprises a circuit element formed above a semiconductor region, wherein the circuit element comprises sidewalls and a top surface. The semiconductor device further comprises a high-k dielectric material formed on the sidewalls and on a portion of the semiconductor region.

BRIEF DESCRIPTION OF THE DRAWINGS

The disclosure may be understood by reference to the following description taken in conjunction with the accompanying drawings, in which like reference numerals identify like elements, and in which.

Figure 1A:
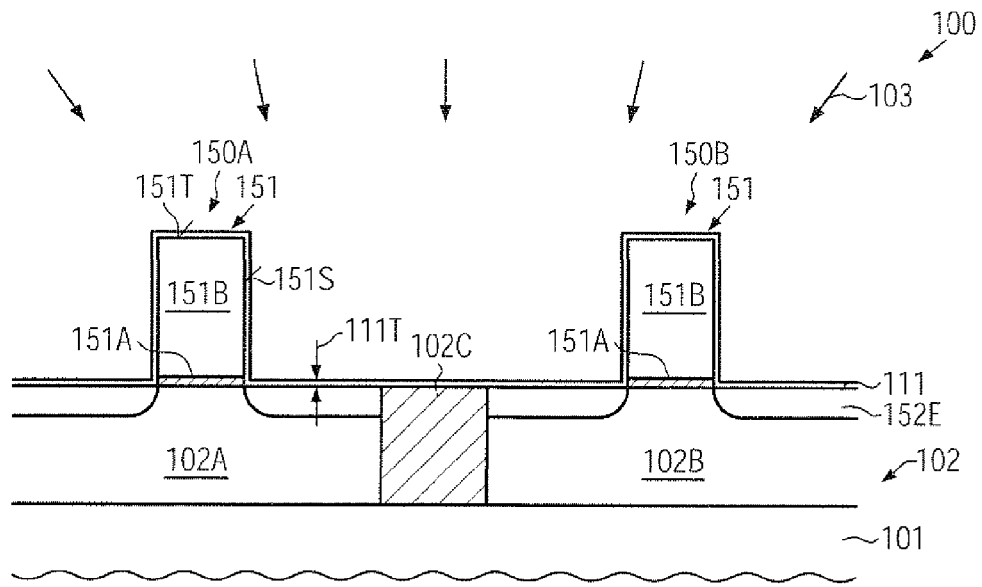
FIGS. 1a-1f schematically illustrate cross-sectional views of a semiconductor device during various manufacturing stages in forming transistor elements on the basis of a sophisticated spacer structure including a high-k etch stop liner material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of patterning spacer materials in sophisticated microstructure devices, wherein the characteristics of conventional etch stop materials, such as silicon dioxide, may result in reduced performance of transistor elements since the required thickness for the etch stop material may negatively affect transistor characteristics, such as dopant concentration in shallow source and drain extension regions, while, in other cases, a very pronounced surface topography may cause additional device variabilities, for instance with respect to implementing strain-inducing mechanisms in the form of a strain-inducing interlayer dielectric material, in the form of an embedded silicon/germanium alloy and the like. In view of this situation, the present disclosure provides techniques and semiconductor devices in which high-k dielectric materials may be used as an efficient etch stop liner during the spacer patterning, since these materials have significantly different etch characteristics in view of a plurality of well-established plasma assisted etch recipes, as are typically used during the processing of sophisticated microstructure devices. For example, tantalum oxide ($Ta_2O_5$), strontium titanium oxide ($SrTiO_3$), hafnium oxide ($HfO_x$), hafnium silicon oxide, zirconium oxide ($ZrO_x$), may increasingly be used, for instance, for gate dielectrics and the like, thereby replacing conventional gate dielectric materials, due to the higher dielectric constant of these materials compared to silicon oxide-based gate dielectrics. Consequently, these materials and corresponding process recipes for forming and patterning the same may be available in complex manufacturing environments for forming microstructure devices, so that these resources may be advantageously used for providing sophisticated spacer structures using these materials as efficient etch stop liners. For example, in illustrative embodiments, hafnium oxide may be used as a highly efficient etch stop liner during the patterning of spacer structures due to its characteristic to substantially not create volatile byproducts during well-established fluorine and chlorine-based plasma assisted etch processes, which may typically be used for etching silicon nitride materials and the like. Due to these superior etch stabilities with respect to plasma assisted etch processes, an increased integrity of the etch stop liner may be obtained, even at a reduced thickness, compared to conventional silicon-based etch stop materials during the spacer forming sequence. Due to the reduced layer thickness, for instance in the range of approximately 10 nm and less, such as 5 nm and less, a superior behavior with respect to dopant out-diffusion of sensitive drain and source extension regions may be achieved, while the efficiency of any strain-inducing mechanisms based on highly stressed interlayer dielectric materials may also be enhanced. Furthermore, generally, the deposition of the interlayer dielectric material and the patterning thereof may be achieved on the basis of a less pronounced surface topography, which may be achieved on the basis of the superior stability of the high-k dielectric etch stop liner material.

FIG. 1a schematically illustrates a cross-sectional view of a semiconductor device 100 comprising a substrate 101 above which may be formed a semiconductor layer 102. The substrate 101 may represent any appropriate carrier material, such as a semiconductor material, an insulating material and the like, in order to form thereabove the semiconductor layer 102. For example, the semiconductor layer 102 may represent a silicon-based semiconductor material since presently and in the near future most of the complex microstructure devices, such as integrated circuits and the like, produced by volume production techniques may be provided on the basis of silicon, due to its nearly unlimited availability and the experience gathered over the last fifty years. It should be appreciated, however, that the principles disclosed herein are not restricted to any specific device architecture or material composition of the semiconductor device 100. The semiconductor layer 102 may comprise an isolation structure 102C, for instance in the form of a shallow trench isolation, which may laterally delineate active regions 102A, 102B within the layer 102. Active regions are to be understood as crystalline or non-ordered semiconductor areas in which at least one PN junction is formed or to be formed in order to obtain the desired electronic behavior of one or more circuit elements 150A, 150B to be formed in and above the active regions 102A, 102B, respectively. In the embodiment shown, the circuit elements 150A, 150B may represent field effect transistors of a planar transistor architecture, wherein it should be appreciated that the elements 150A, 150B may represent any other circuit elements that require spacer elements at a specific manufacturing stage. In the embodiment shown, the transistors 150A, 150B may comprise a further circuit component or element 151 in the form of a gate electrode structure, which may comprise a gate dielectric material 151A that separates an electrode material 151B from the corresponding active region 102A, 102B. It should be appreciated that the gate dielectric material 151A may have any appropriate configuration as required for the elements 150A, 150B, wherein, as previously explained, a high-k dielectric material may be provided in the layers 151A, 151B, possibly in combination with "conventional" dielectric materials, such as silicon dioxide and the like. Similarly, the electrode material 151B may be provided in the form of any appropriate material or materials, such as silicon material, silicon/germanium material, a metal-containing material and the like, wherein the materials 151B may have a different material composition for the device 150A, 150B, if required. It should be appreciated that the structures 151 may have a critical dimension, such as a length, i.e., in FIG. 1a, the horizontal extension of the electrode material 151B, of approximately 40 nm and less, if sophisticated planar transistors are considered. Moreover, in the manufacturing stage shown, a shallow doped region 152E may be formed in the active regions 102A, 102B on the basis of an appropriate dopant species, such as a P-type dopant species for P-channel transistors and an N-type dopant species for an N-channel transistor. As discussed above, the regions 152E may also be referred to as drain and source extension regions and may have a moderately high dopant concentration. Moreover a high-k dielectric liner or layer 111 may be formed above the active regions 102A, 102B so as to cover the gate electrode structures 151, i.e., a top surface 151T and sidewalls 151S may be covered by the liner 111. Furthermore, the liner 111 may also be formed on the isolation structure 102C. The high-k dielectric material 111 may be comprised of any of the above-described materials and may have a thickness of approximately 10 nm and less, for instance 5 nm and less, while at the same time providing superior etch resistivity during the subsequent processing compared to a conventionally used silicon dioxide-based etch stop material.

The semiconductor device 100 as illustrated in FIG. 1a may be formed on the basis of the following processes. Prior to or after forming the isolation structure 102C using sophisticated lithography and etch techniques in combination with the deposition and planarization of appropriate dielectric materials, the active regions 102A, 102B may be formed by ion implantation and the like in order to introduce a basic dopant concentration in accordance with the conductivity type required for the corresponding active region. Next, the structures 151 may be formed by forming an appropriate layer stack that may be different for the devices 150A, 150B, if required, and by patterning the layer stack using sophisticated lithography and etch techniques. Next, the regions 152E may be formed, possibly in combination with any offset spacer element (not shown) formed on sidewalls 151S of the gate electrode structures 151. For example, a silicon nitride spacer material may be formed, for instance in view of avoiding exposure of sensitive materials of the gate electrode structure 151, while, in other cases, an oxide material may be used as an offset spacer, if required. It should be appreciated that a corresponding implantation sequence for forming the regions 152E may comprise additional implantation steps, for instance, for forming any counterdoped regions connecting to the regions 152E, for forming a pre-amorphization implantation and the like, as may be required to obtain the complex dopant profile within the active regions 102A, 102B. If desired, after forming the active regions 102A, 102B and/or after forming the regions 152E, an anneal process may be performed to activate the previously introduced dopant species. Next, a deposition process 103 may be performed, for instance in the form of a chemical vapor deposition process and the like, using any appropriate recipes for forming the high-k dielectric material 111. As previously explained, high-k dielectric materials may be increasingly used as material for the gate dielectric layers 151A and hence corresponding process recipes and deposition tools may be available in the manufacturing environment for forming the device 100. Thus, during the deposition process 103, the thickness 111T of the layer 111 may be appropriately controlled to the above-specified range.

Figure 1B:
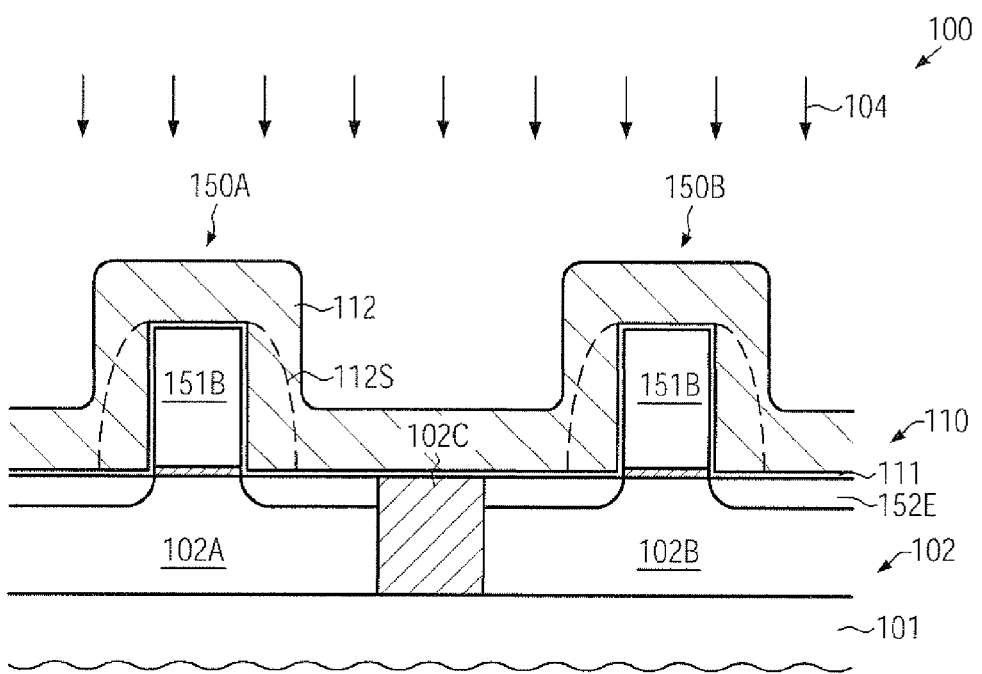

FIG. 1b schematically illustrates the semiconductor device 100 in a further advanced manufacturing stage in which a spacer layer stack 110 is formed above the device 100 and may comprise the high-k dielectric liner 111 and a spacer layer 112, which may be comprised of any appropriate material or materials, such as silicon nitride, silicon dioxide, silicon carbide or any mixture of these components. It should be appreciated that the spacer layer 112 may be deposited by using any appropriate deposition recipe, such as plasma enhanced chemical vapor deposition (CVD), thermally activated CVD and the like. As discussed above, a thickness of the spacer layer 112 may be appropriately selected so as to obtain, in combination with appropriately selected process parameters of a plasma assisted etch process 104, a spacer element 112S with a desired width. In some illustrative embodiments, the spacer layer 112 may be provided in the form of a silicon nitride material, thereby providing a high degree of compatibility with conventional spacer formation techniques, wherein, however, superior performance of corresponding spacer structures may be achieved, for instance with respect to dopant depletion of the regions 152E, due to the reduced thickness of the layer 111 compared to a conventional spacer layer stack.

In other illustrative embodiments, the spacer layer 112 may be provided in the form of silicon dioxide, if considered appropriate, while, in still other cases, two or more materials may be used, such as silicon nitride in combination silicon dioxide and the like, since, during the etch process 104, any appropriate etch chemistry may be used so that even different materials may be etched in a common process, while the high-k dielectric liner material 111 may still provide sufficient etch stop capabilities.

Figure 1C:
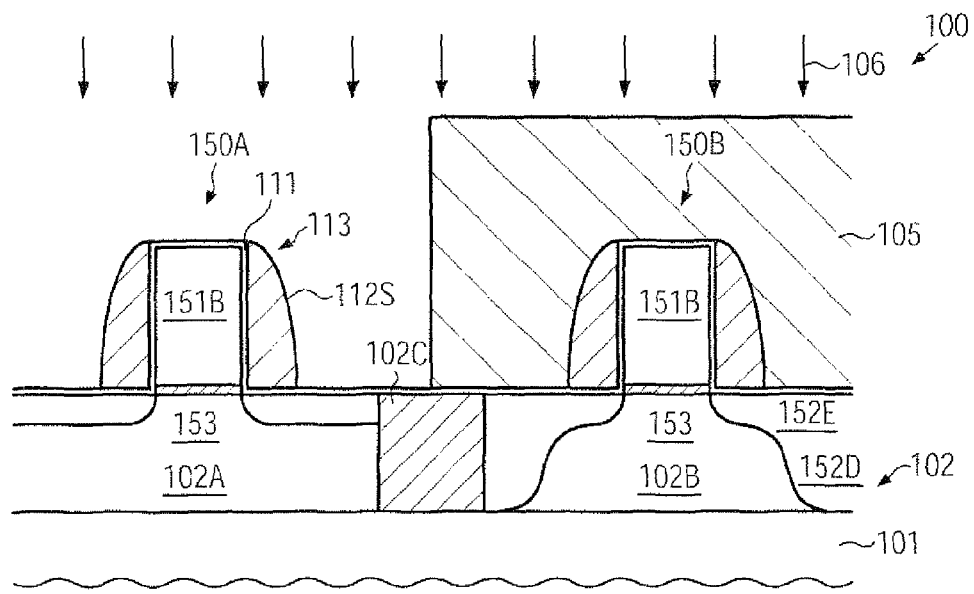

FIG. 1c schematically illustrates the semiconductor device 100 in a further advanced manufacturing stage. As illustrated, the transistors 150A, 150B comprise a spacer structure 113 including the spacer element 112S and the high-k dielectric liner 111, which may still cover the active regions 102A, 102B and the isolation structure 102C. Moreover, in the embodiment shown, drain and source regions may be provided in the active region 102B and may include the extension regions 152E and deep drain and source regions 152D, which may have been formed on the basis of the spacer structure 113. For example, the transistor 150B may represent a P-channel transistor or an N-channel transistor, while the transistor 150A may represent the other one of the P-channel transistor and N-channel transistor. Moreover, an implantation mask 105, such as a resist mask, may be formed so as to cover the transistor 150B and expose the transistor 150A to a further implantation process 106 that may be performed to introduce a dopant species into the active region 102A while using the spacer structure 113 as an efficient implantation mask.

The device 100 as illustrated in FIG. 1c may be formed on the basis of any appropriate process strategy, for instance by forming a mask for covering the transistor 150A and incorporating the dopant species for the regions 152D, removing the corresponding mask and forming the mask 105 on the basis of well-established lithography techniques. During the process sequence or any other process steps, the liner 111 may still cover a portion of the active regions 102A, 102B and the isolation structure 102C due to its superior etch resistivity, thereby avoiding or at least significantly reducing any material erosion of these areas. Furthermore, during the implantation process 106, the dopant species may be implanted through the exposed portion of the layer 111, which, however, may not unduly affect the implantation process due to the reduced thickness of the layer 111. It should be appreciated that, in other process strategies, the spacer structure 113 may contain one or more additional spacer elements, which may be accomplished by forming additional etch stop liners, such as the liners 111, in combination with a corresponding spacer layer, which may then be etched so as to obtain the further spacer element, as is also described above with reference to the spacer element 112S and the liner 111. After each spacer element, a further implantation process may be applied, thereby providing a more complex lateral and vertical profile of the drain and source regions 152 (see FIG. 1d) of one or both of the transistors 150A, 150B.

As discussed above, in sophisticated semiconductor devices, frequently, performance of the transistors 150A and/or 150B may be enhanced by inducing a strain component in channel regions 153 by implementing an appropriate strain-inducing mechanism. One efficient mechanism, which is typically referred to as stress memorization technique, relies on the fact that strain may be induced in the channel region 153 by substantially amorphizing a portion of the active regions 102A, 102B, which may be accomplished by introducing a heavy dopant species or by using a dedicated inert species, such as xenon, and subsequently annealing the substantially amorphized area in the presence of a rigid material formed above the structure 151 and the active region 102A and/or 102B. For example, a typical material may be silicon nitride, which may also be used as a spacer element. Thus, prior to actually patterning the spacer material on the basis of the liner 111, the substantially amorphized material may re-crystallize in a strained state, thereby also inducing a strain in the channel region 153. Thereafter, the spacer layer may be patterned, as previously described, wherein, nevertheless, a significant amount of the previously created strain may be preserved. On the other hand, due to the reduced thickness of the layer 111 and due to the diffusion blocking capabilities of the corresponding rigid material, undue out-diffusion of dopant species from, for instance, the regions 152E, may be avoided so that, in total, a performance gain may be obtained by the induced strain component, while, on the other hand, a loss of dopant species may be less critical. In a similar manner, the strain memorization technique may be applied several times if a plurality of spacer elements may be formed in the spacer structure 113. In other cases, the spacer structure 113 may receive two or more spacer elements without applying the stress memorization technique as described above. At any rate, upon a final anneal process for activating the dopant species and re-crystallizing implantation-induced damage, the degree of out-diffusion of dopants from the extension regions 152E into the material 111 may be significantly less compared to the dopant loss in conventional spacer systems.

Figure 1D:
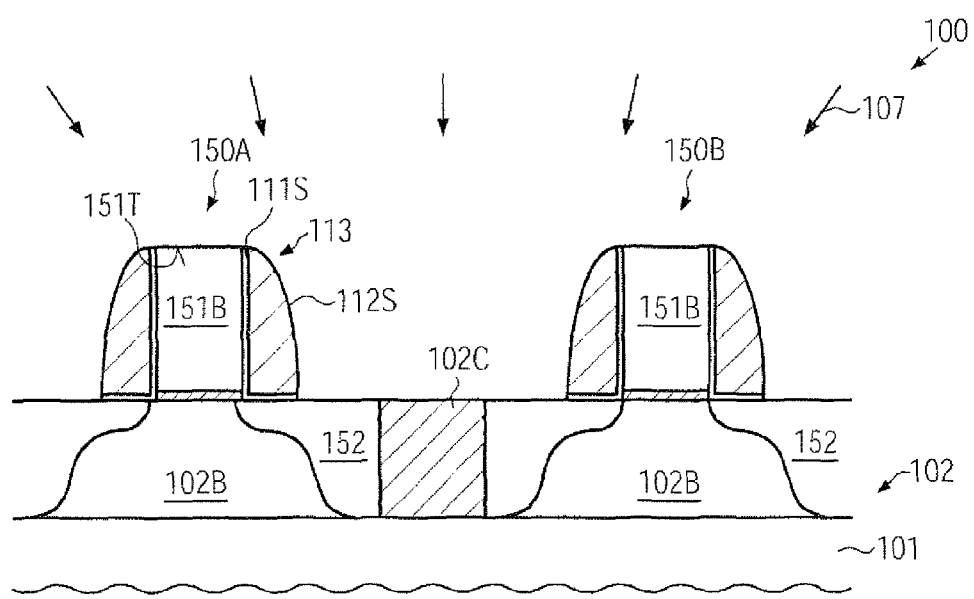

FIG. 1d schematically illustrates the semiconductor device 100 in a further advanced manufacturing stage. That is, after completing the drain and source regions 152 of both transistors 150A, 150B, the device 100 may be exposed to a reactive process ambient 107 in order to remove an exposed portion of the high-k dielectric material 111, thereby obtaining the spacer structure 113 which may still contain the high-k dielectric material, as indicated by 111S, while exposing a portion of the active regions 102A, 102B and possibly the top surface 151T. The reactive process ambient 107 may be established on the basis of a wet chemical etch chemistry using hydrofluoric acid (HF) with appropriately selected process parameters, such as temperature, concentration and the like, which may readily be determined for a specific type of high-k material used in the layer 111 by performing corresponding experiments. Consequently, the layer 111 may be efficiently removed selectively to the drain and source regions 152, while also any material erosion of the isolation structure 102C may be kept at a low level due to the reduced thickness and the improved uniformity of the layer 111. In other illustrative embodiments, additionally or alternatively to a wet chemical etch chemistry, a sputter etch process may be applied, in which a physical particle bombardment may actually remove layer 111 by physical interaction. For this purpose, ion beam sputtering and the like may be applied, wherein a corresponding material erosion of other components, such as the spacers 112S, may be negligible due to the short overall process time.

Figure 1E:
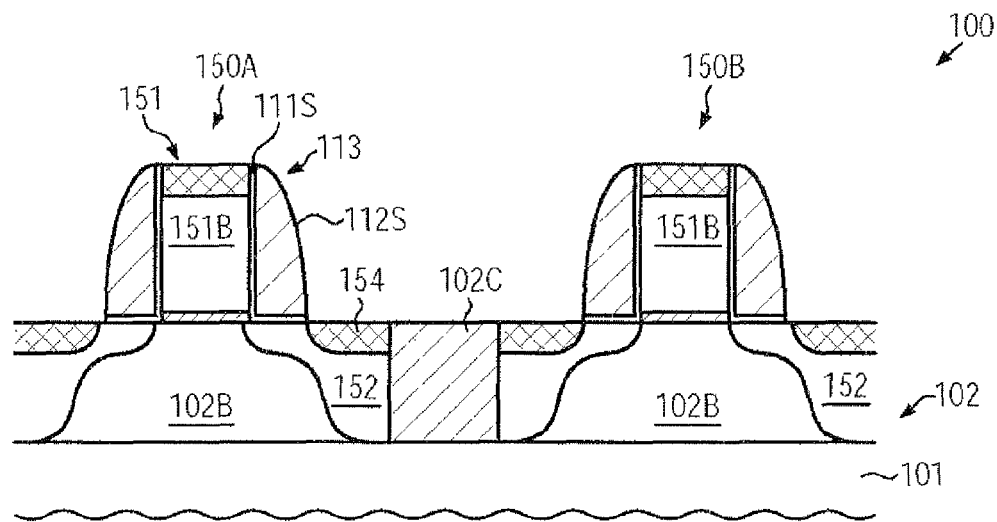

FIG. 1e schematically illustrates the device 100 in a further advanced manufacturing stage in which a metal compound 154 may be formed in the drain and source regions 152 and possibly in the gate electrode structures 151. For example, in silicon-based semiconductor devices, the metal compound 154 may be provided in the form of a metal silicide, such as nickel silicide, platinum silicide and the like, thereby significantly increasing the overall conductivity of the drain and source regions 152 and providing low ohmic contact areas for contact elements still to be formed. The material 154 may be formed on the basis of any appropriate process technique, such as a silicidation process, in which a refractory metal may be deposited and may be heat treated in order to initiate a chemical reaction that results in the formation of a metal silicide compound. Thereafter, any non-reacted material above dielectric areas, such as the spacer structure 113 and the isolation structure 102C, may be removed by selective etch chemistries, possibly followed by further heat treatments to stabilize the material 154.

Next, the processing may be continued by depositing an interlayer dielectric material, such as silicon nitride, nitrogen-containing silicon carbide and the like, in combination with other materials, such as silicon dioxide, which may be accomplished on the basis of well-established techniques. As discussed above, frequently, at least a portion of the interlayer dielectric material may be provided in the form of a stressed dielectric material in order to induce a strain component in the channel regions 153. For this purpose, silicon nitride, silicon carbide in combination with nitrogen, silicon oxide and the like may be deposited with high internal stress levels, thereby imparting compressive or tensile strain to the transistors 150A, 150B, as required. During the corresponding deposition process and possibly the patterning processes required for selectively providing a dielectric material of high compressive stress above one of the transistors 150A, 150B and providing a dielectric material with a high tensile stress above the other one of the transistors 150A, 150B, the superior surface topography obtained by the layer 111 may result in enhanced process uniformity. Furthermore, due to the reduced thickness of the layer 111S, the overall stress transfer from the interlayer dielectric material to the channel region 153 may be increased compared to conventional devices.

Figure 1F:
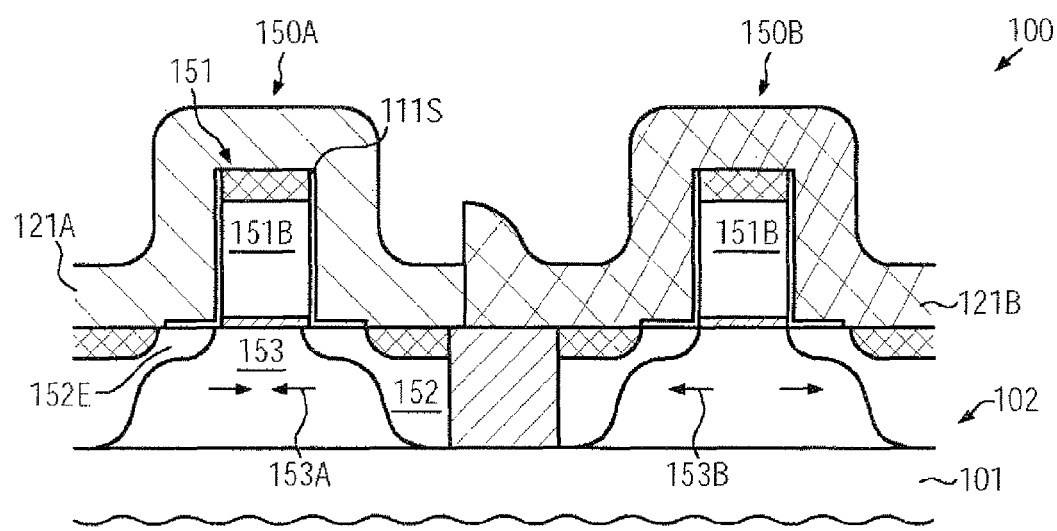

FIG. 1f schematically illustrates the semiconductor device 100 with a first strain-inducing dielectric material 121A formed above the transistor 150A and a second strain-inducing dielectric material 121B formed above the transistor 150B. Consequently, a corresponding strain component 153A may be obtained in the channel region 153 of the transistor 150A, depending on the internal stress level of the layer 121A. Similarly, a strain component 153B may be obtained in the transistor 150B caused by the high internal stress level of the material 121B. Furthermore, in the embodiment shown in FIG. 1f, additionally, the overall strain transfer efficiency may be enhanced by removing at least a portion of the spacer element 112S (FIG. 1e) so that the materials 121A, 121B, respectively, may be positioned more closely to the channel region 153. A corresponding material removal of the spacer element 112S may be accomplished by using any appropriate etch recipe, during which the increased etch resistivity of the high-k dielectric liner 111S may provide the integrity of the extension region 152E and the gate electrode structure 151. For example, during a corresponding plasma assisted etch process, material erosion of the extension region 152E and thus a loss of dopant may be efficiently suppressed.

It should be appreciated that any appropriate process strategy may be applied for providing the materials 121A, 121B, wherein one or more additional etch stop materials may be incorporated (not shown) in order to appropriately pattern the materials 121A, 121B without unduly affecting any underlying materials. For this purpose, a high-k dielectric material may be used as an efficient etch stop material.

Figure 1G:
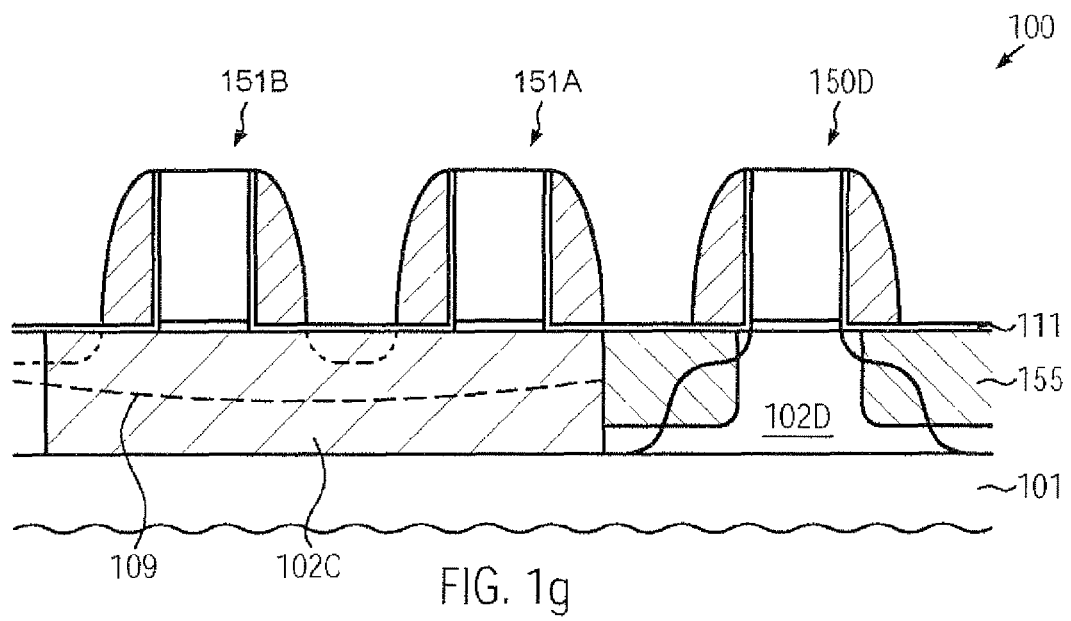
FIG. 1g schematically illustrates a cross-sectional view of a semiconductor device in which a superior topography with respect to isolation structures and active regions of sophisticated transistors may be obtained on the basis of a high-k etch stop liner, according to further illustrative embodiments.

FIG. 1g schematically illustrates the semiconductor device 100 according to further illustrative embodiments in which a transistor 150D may be formed in and above an active region 102D, which is laterally delineated by the isolation structure 102C. As shown, the active region 102D may contain a strain-inducing semiconductor alloy 155, such as a silicon/germanium alloy, a silicon/carbon alloy and the like. Moreover, the transistor 150D may comprise a gate electrode structure which may have a similar configuration as previously described with reference to the transistors 150A, 150B (FIG. 1e). Furthermore, portions of gate electrode structures 151A, 151B may be formed above the isolation structure 102C so as to connect to other transistors, as may typically be required in densely packed device regions, such as static memory areas and the like. As illustrated, the gate electrode structures 151A, 151B may have a similar configuration as the structures 151, wherein the high-k dielectric etch stop liner 111 may still cover the active region 102D and the isolation structure 102C. Consequently, a pronounced recessing of the isolation structure 102C, in particular in areas in which the strain-inducing semiconductor alloy 155 is to be provided, may be avoided due to the high stability of the layer 111. For convenience, a corresponding recessing and thus increased surface topography is indicated by the dashed line 109. In this case, the deposition of an interlayer dielectric material may frequently be associated with the creation of deposition-related irregularities, such as voids between the closely packed gate electrode structures 151B, 151A, which may finally result in contact failures upon patterning the interlayer dielectric material. Consequently, due to the superior surface topography, respective contact failures may be reduced, in particular when additional patterning processes have to be applied so as to form interlayer dielectric materials of different stress components, as discussed above with reference to FIG. 1f.

Figure 1H:
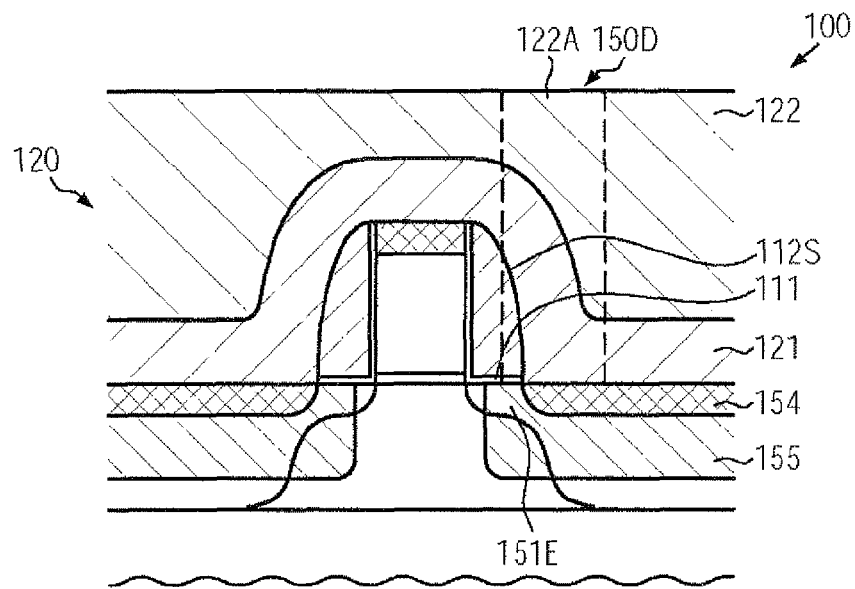
FIG. 1h schematically illustrates a cross-sectional view of a transistor device formed on the basis of a high-k dielectric material used as etch stop liner in a spacer structure, which may also provide superior process conditions during the formation of contact elements, according to still further illustrative embodiments.

FIG. 1h schematically illustrates the semiconductor device 100 in which the transistor 150D is illustrated in a further advanced manufacturing stage. As shown, the metal silicide regions 154 are provided, and an interlayer dielectric material 120 is formed above the transistor 150D. The material 120 may comprise a first material 121, such as a silicon nitride material and the like, possibly in a highly stressed state, as previously discussed, followed by an oxide material 122 or any other appropriate material. With respect to any process techniques for forming the transistor 150D as illustrated in FIG. 1h, it may be referred to the above-described embodiments. After providing the interlayer dielectric material 120, a patterning process may be performed to form a contact opening 122A therein, which may be accomplished on the basis of well-established lithography and etch techniques. During a final stage of the patterning process, the layer 121 may have to be etched to expose a portion of the metal silicide region 154, wherein, due to any positioning inaccuracies, a portion of the spacer element 112S may also be removed. In this case, the layer 111 may still reliably protect the underlying extension region 152E and may thus avoid an undue material loss of the strain-inducing semiconductor alloy 155, which may otherwise result in a significant reduction of the strain component induced by the alloy 155. Consequently, also in this case, the high-k dielectric material 111 may provide superior transistor performance compared to conventional spacer structures.

As a result, the present disclosure provides semiconductor devices and manufacturing techniques in which sophisticated spacer structures are provided on the basis of a high-k dielectric liner material, which may thus provide superior etch resistivity at a reduced thickness compared to conventional spacer material systems. Therefore, negative effects, such as significant dopant loss, pronounced surface topography and the like, which are typically associated with conventional spacer systems in highly advanced semiconductor devices, may be significantly reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a spacer layer stack above a circuit feature formed above an active region of a semiconductor device, said spacer layer stack comprising an etch stop liner and a spacer material formed above said etch stop liner, said etch stop liner comprising a high-k dielectric material;

forming a spacer element on sidewalls of said circuit feature by performing a plasma assisted etch process and using said etch stop liner as an etch stop material; and forming a strain-inducing dielectric material above said active region, said circuit feature, and said spacer element in the presence of at least a portion of said etch stop liner.

2. The method of claim 1, wherein forming said spacer layer stack comprises forming said etch stop liner with a thickness of approximately 10 nm or less.

3. The method of claim 1, wherein said etch stop liner comprises at least one of hafnium, tantalum, strontium and zirconium.

4. The method of claim 3, wherein said etch stop liner comprises hafnium oxide.

5. The method of claim 1, wherein forming said spacer layer stack comprises forming said spacer layer stack above an isolation structure that laterally delineates said active region.

6. The method of claim 1, further comprising performing an implantation process and using said spacer element as an implantation mask so as to form a doped region in said active region.

7. The method of claim 6, further comprising removing a portion of said etch stop liner that is not covered by said spacer element and forming a metal compound in an exposed portion of said active region.

8. The method of claim 7, wherein removing said portion of said etch stop liner comprises performing a wet chemical removal process on the basis of hydrogen and fluorine (HF).

9. The method of claim 7, further comprising removing at least a portion of said spacer element after forming said metal compound, wherein said etch stop liner is used as an etch stop material.

10. A method, comprising:
forming a high-k dielectric material layer above an active region of a transistor so as to cover a gate electrode structure formed at least partially on said active region;

forming a spacer layer on said high-k dielectric material layer;

forming a spacer element from said spacer layer at sidewalls of said gate electrode structure by performing a plasma assisted etch process and using said high-k dielectric material layer as an etch stop material; and forming a strain-inducing dielectric material above said active region, said circuit feature, and said spacer element in the presence of at least a portion of said etch stop liner.

11. The method of claim 10, further comprising performing at least one of an etch process and an implantation process and using said spacer element as a mask.

12. The method of claim 11, wherein performing an implantation process comprises introducing an implantation species through an exposed portion of said high-k dielectric material.

13. The method of claim 12, further comprising removing said exposed portion of said high-k dielectric material after said implantation process by performing at least one of a sputter etch process and a wet chemical etch process.

14. The method of claim 13, further comprising forming a metal silicide in an exposed portion of said active region after removing said exposed portion of said high-k dielectric material.

15. The method of claim 11, wherein forming a strain-inducing dielectric material further comprising forming the strain-inducing dielectric material after performing said at least one of an etch process and an implantation process.

16. The method of claim 15, further comprising removing at least a portion of said spacer element prior to forming said strain-inducing dielectric material by using said high-k dielectric material layer as an etch stop material.

17. The method of claim 10, wherein said high-k dielectric material layer comprises at least one of hafnium, tantalum, strontium and zirconium.

* * * * *